United States Patent [19]

Jester

[11] Patent Number: 5,654,045

[45] Date of Patent: Aug. 5, 1997

[54] MULTIAXIALLY REINFORCED LCP SHEET

[75] Inventor: Randy Douglas Jester, Greer, S.C.

[73] Assignee: Hoechst Celanese Corp., Somerville, N.J.

[21] Appl. No.: 994,386

[22] Filed: Dec. 21, 1992

[51] Int. Cl.⁶ .................................................. C09K 19/00
[52] U.S. Cl. .............. 428/1; 428/212; 428/457; 428/458; 428/480; 428/910
[58] Field of Search ................. 428/1, 212, 457, 428/458, 480, 910

[56] References Cited

U.S. PATENT DOCUMENTS

| | | | |
|---|---|---|---|
| 4,161,470 | 7/1979 | Calundann | 524/599 |
| 4,184,996 | 1/1980 | Calundann | 524/605 |
| 4,279,803 | 7/1981 | Calundann | 524/601 |
| 5,070,157 | 12/1991 | Isayev | 525/444 |
| 5,238,638 | 8/1993 | Isayev | 264/257 |
| 5,248,530 | 9/1993 | Jester | 428/1 |

*Primary Examiner*—Leszek Kiliman
*Attorney, Agent, or Firm*—James L. McGinnis

[57] ABSTRACT

A melt consolidated, multiaxially oriented liquid crystal polymer ("LCP") sheet or other article formed from LCP particles. One embodiment includes a multi-component LCP sheet in which particles of a higher melting LCP are imbedded in a matrix of a lower melting LCP. These LCP components are formed into sheet at a temperature between the melting point of the lower melting matrix LCP and the higher melting reinforcing LCP, so that the imbedded LCP particles may maintain their shape, orientation, and mechanical characteristics while the matrix LCP component flows around the particles and forms a solid sheet. In another embodiment, LCP particles are melt consolidated to form a single article in which a significant amount of LCP orientation is retained. A sheet of this invention may be formed by a variety of processes, and may be made from recycled scrap LCP.

10 Claims, No Drawings

MULTIAXIALLY REINFORCED LCP SHEET

BACKGROUND OF THE INVENTION

This invention relates to the field of polymer sheet or film, particularly thermotropic liquid crystalline polymer ("LCP") sheet having one or more LCP components.

A variety of thermotropic liquid crystal polymers and films made therefrom are known in the art. For example, U.S. Pat. No. 4,161,470 discloses a polyester of 6-hydroxy-2-naphthoic acid and p-hydroxy benzoic acid capable of undergoing melt processing, U.S. Pat. No. 4,184,996 discloses melt processible thermotropic wholly aromatic polyesters, and U.S. Pat. No. 4,279,803 discloses a polyester of phenyl-4-hydroxybenzoic and 4-hydroxybenzoic acid and/or 6-hydroxy-2-naphthoic acid.

Other patents disclosing LCPs include U.S. Pat. Nos. 3,991,013, 3,991,014, 4,057,597, 4,066,620, 4,067,852, 4,075,262, 4,083,829, 4,093,595, 4,118,372, 4,130,545, 4,219,461, 4,267,289, 4,276,397, 4,330,457, 4,339,375, 4,341,688, 4,351,917, 4,351,918, 4,355,132, 4,355,133, 4,371,660, 4,375,530, 4,460,735, 4,460,736, 4,473,682, 4,489,190, 4,581,443, 4,671,969, 4,673,591, 4,726,998, 4,752,643, 4,770,777, 4,772,421, 4,857,255, 4,898,924, and 4,913,867.

The disclosures of all the aforementioned patents are herein incorporated by reference.

Due to the particular molecular structure of thermotropic liquid crystal polymers, LCP film can be molecularly oriented in the melt phase, uniaxially, biaxially, or otherwise. After the extruded LCP cools and solidifies, the molecular orientation is maintained. When the orientation is uniaxial, this results in a film having anisotropic properties, such as enhanced mechanical properties in the direction(s) of orientation (e.g. high strength and stiffness). However, the film's properties in other directions are often much poorer.

In producing LCP film/sheet, molded articles, and fibers, there is a certain amount of scrap LCP left over after processing. Due to the expensive nature of this material, and in keeping with modern environmental theory, it is desirable to recycle this material. Recycling scrap is especially difficult if the scrap contains a mixture of materials. For example, in processes for producing the coextruded LCP film described in pending U.S. Pat. application Ser. No. 800,774 filed Nov. 27, 1991, now U.S. Pat. No. 5,248,530 the disclosure of which is herein incorporated by reference, one would expect the scrap to contain at least two liquid crystal polymer components.

SUMMARY OF THE INVENTION

In general, the present invention comprises a sheet comprising oriented liquid crystal polymer ("LCP") particles wherein the direction of orientation of the particles varies randomly, producing an isotropic LCP sheet.

In one aspect, the present invention comprises a multi-component LCP sheet or other article wherein particles of a higher melting LCP are enclosed or imbedded in a matrix of a lower melting LCP. These LCP components are formed into said sheet or other article at a temperature between the melting point of the lower melting matrix LCP and the melting point of the higher melting reinforcing LCP, so that the higher melting LCP particles may maintain their shape, orientation, and mechanical characteristics while the matrix LCP component flows around the particles and forms a solid sheet. The imbedded particles tend to reinforce the matrix polymer.

The LCP starting materials may comprise particles derived from a coextruded film or fiber containing both the higher and lower melting liquid crystal polymers, or a blend of lower-melting LCP particles and higher-melting LCP particles. These particles may include chopped film, chopped fiber, flake, and the like.

A sheet according to this aspect of the invention may be formed by a variety of processes, provided that the process used is performed at a temperature between the melting points of the LCP components so that one component melts to form the matrix and another component remains in particulate form. Such processes include: melt extrusion through a die; consolidation of a layer of scrap LCP particles under heat and pressure, e.g., in a press; and, fluxing the scrap material in a roll mill, extruder, or mixer followed by calendering.

In a second aspect, the present invention comprises a sheet produced by the melt consolidation of oriented particles of a single LCP. These particles may be in the form of chopped or ground film, fiber, fiber mat, pellets, or mixtures thereof. After the particles are melt consolidated, they exhibit random orientation, producing a sheet having isotropic multiaxial orientation and balanced physical properties.

It is an object of the present invention to recycle scrap LCP into a useful form.

It is another object of the present invention to provide a multiaxially reinforced LCP sheet.

It is a further object of the present invention to provide a process for making a multiaxially reinforced LCP sheet.

Other objects and advantages of the present invention will be apparent to those skilled in the art from the following description and the appended claims.

DETAILED DESCRIPTION OF THE PREFERRED EMBODIMENTS

In a preferred embodiment of the present invention, LCP film comprising two coextruded LCP components having different melting points is ground into particles, e.g. flakes, and these particles are processed at a temperature between the two melting points to make a sheet according to the present invention. (The equivalent terms "sheet" and "film" are used interchangeably throughout this specification.)

By processing the particles at such a temperature, the lower melting LCP will melt and flow to form a matrix, but the higher melting LCP particles will maintain their structural integrity, including any orientation or anisotropy. The resulting sheet of this invention comprises particles of higher melting LCP imbedded in a matrix of lower melting LCP. The imbedded particles are randomly distributed and oriented in the matrix, and serve to provide multiaxial reinforcement for the matrix material.

The LCP sheet of this invention may include more than two components. For example, if three LCP components are present there may be two types of imbedded particles in a lower melting LCP matrix, or one higher melting LCP may be imbedded in a blend of two lower melting components, depending upon the LCP melting points and the processing temperature chosen. More than three components are also possible. One or more non-LCP components may also be included. Virtually any LCP may be included as a component in the sheet of the present invention.

Although a higher melting LCP that is to be imbedded in a matrix material must be used in the form of particles, e.g., flakes, fibrils, chopped strand, and the like, the polymer matrix may be made from any form of material since it is to be melted. In one variation of the preferred embodiment described above, additional neat matrix resin is added to the recycled scrap material to dilute the higher melting component, or the matrix resin may be entirely non-recycled material, i.e. neat resin, which is mixed with particles of a higher melting LCP in any desired ratio. In this way, the proportion of the components may be adjusted as desired.

The reinforced multiaxially oriented LCP sheet of the present invention exhibits balanced physical properties and coefficient of thermal expansion due to the isotropic distribution of the imbedded particles, even if the matrix material is anisotropic. The sheet has the good physical and chemical properties expected of an LCP, such as chemical resistance, good tensile strength, and stiffness.

Examples of liquid crystal polymers useful in the practice of this invention include the VECTRA® polyester resins available from Hoechst Celanese Corporation, having its headquarters in Bridgewater, N.J. VECTRA® A polyester (melting point about 280° C.) comprises 73 mole % of repeating monomer units derived from 4-hydroxybenzoic acid ("HBA") and 27 mole % of monomer units derived from 2,6-hydroxynaphthoic acid ("HNA"). VECTRA® E polyester (m. p. about 350° C.) comprises 60 mole % of repeating units derived from HBA, 4 mole % derived from HNA, 18 mole % derived from terephthalic acid ("TA") and 18 mole % derived from biphenol. VECTRA® C polyester (m. p. about 320° C.) comprises 80 mole % of repeating units derived from HBA and 20 mole % derived from HNA. VECTRA® B polyester comprises 60 mole % of monomer units derived from HNA, 20 mole % derived from TA, and 20 mole % derived from acetaminophen. There are several different grades of each type of VECTRA; the grades vary in their molecular weight distributions. The melting points stated for the several types of VECTRA may vary, depending upon the specific grade of polymer.

Other liquid crystal polymers may also be used in the practice of this invention; for example, XYDAR® polyester (a polymer product comprising monomers units derived from HBA, TA and 4,4'-biphenol sold by Amoco Corp.).

The reinforced LCP sheet of this invention may be made by a variety of methods. In one preferred process, LCP flakes comprising at least two LCP components having different melting points are spread in a layer and hot pressed into a sheet at a temperature between the melting points of the two polymers.

In another preferred process, the LCP components are mixed in an extruder and extruded through a sheet die at a temperature between the melting points of the two polymers; alternatively, the polymers may be calendered into a sheet at a temperature between the melting points of the two polymers, rather than extruded through a die. Where the hot calendering process is employed, the polymers may be fluxed in a roll mill, mixer, extruder, or any suitable device known in the art.

The sheet of this invention may also preferably be made using an isobaric double belt press to uniformly apply heat and pressure. The belts can have a non-stick surface, or a release film may be fed into the press on each side of the LCP.

The LCP components may be formed into a sheet according to this invention by any sheet-forming process known in the art provided that the process causes the lower melting component, but not the higher melting component, to melt, and does not cause undesirable chemical reactions or significant degradation of the polymers.

Although not necessary in the practice of the present invention, post-processing steps may be performed if desired. For example, after the reinforced sheet has been formed it optionally may be calendered, stretched, coated or laminated with other materials, and so forth. As long as the imbedded LCP particles are not melted or separated from the matrix by post-processing, the sheet will retain its properties.

Although the invention has been described in terms of sheet, the same multiaxially reinforced material can easily be used to make molded articles. The LCP components can be pressed into molded articles of almost any shape at a temperature between the melting points of the polymers. As with sheet, additional LCP or non-LCP components may be included.

In another preferred embodiment of the present invention, a sheet is produced by the melt consolidation of oriented particles of a single LCP. These particles may be in the form of chopped or ground film, chopped fiber, fiber mat, pellets, or mixtures thereof. After the particles are melt consolidated, they exhibit random orientation, producing a sheet having isotropic multiaxial orientation and balanced physical properties. Virtually any LCP may be included as a component in the sheet of this invention.

One preferred process for making such sheet is to spread LCP particles randomly on a mat and press the particles at a temperature at or above the melting temperature of the LCP to form a sheet with balanced physical and thermal properties, i.e., an isotropic sheet. This process is particularly suited to thick sheets, e.g., sheets at least about 5 mils thick.

Due to the unique properties of LCP, the individual melt-consolidated particles retain a significant amount of their original orientation. Thus, the superior strength and other properties of LCP are retained but, because of the random orientation of the particles, a multiaxially oriented sheet is formed. It is preferable to keep the melt consolidation time to a minimum to retain as much orientation as possible. The optimum time in a particular case can easily be determined by those skilled in the art without undue experimentation.

The sheets of this invention may be laminated to other materials such as metals (e.g., copper, aluminum, silver, etc.) and other plastics to provide a laminate having an isotropic LCP layer. These laminates may be particularly useful in the electronic or electrical area as dielectric layers in circuit boards and other devices; in these applications, the balanced coefficient of thermal expansion of the sheet is especially important. LCP sheet at least 5 mils thick having balanced properties is especially useful in rigid circuit boards; these films are difficult to produce using conventional orientation processes, e.g., blown film processes, but can be produced without great difficulty according to the present invention.

The sheets of the present invention also can be used for any other applications where an LCP sheet having balanced properties is needed, whether as part of a laminate or alone. Although all the potential uses of this invention cannot be listed here, the properties described herein will lead those skilled in the arts to find many other uses for the sheet of this invention.

The following Examples are presented to illustrate several embodiments of the present invention, but the scope of this invention is not limited to the embodiments illustrated and described.

EXAMPLE I

A 2-mil LCP film comprising VECTRA® A polyester was chopped into pieces approximately 1 cm square. These pieces were spread evenly on a KAPTON® polyimide film and a second KAPTON® polyimide film was placed on top of the particles to keep the pieces from moving or sticking to the press surfaces. The sandwich of films and LCP pieces was inserted into and run through a Held Corp. double belt press operating at 320° C., 25 Bar pressure, and 3 meters per min. speed (residence time in press: about 2 min.). The polyimide films were then peeled away and a uniform 10-mil thick LCP sheet was revealed. Tensile properties of this sheet were measured by standard techniques known in the art. The results are presented in Table I. This multiaxially oriented sheet proved to have relatively balanced tensile properties.

TABLE I

|  | Tensile Strength | Initial Modulus | Percent Elongation | Coefficient of Thermal Expansion (0° C.–100° C.) |
| --- | --- | --- | --- | --- |
| Machine direction | 9.3 kpsi | 123 kpsi | 13.9% | 39 PPM/°C. |
| Transverse direction | 8.6 kpsi | 121 kpsi | 25.7% | 56 PPM/°C. |

EXAMPLE II

A 10-mil thick coextruded LCP film comprising VECTRA® A polyester and VECTRA® C polyester was chopped into pieces approximately 1 cm square and processed according to the process used in Example I, except that the press temperature was 300° C. VECTRA® A polyester melts at about 280° C. and VECTRA® C polyester melts at about 320° C. By this method, a consolidated sheet about 40 mils thick was obtained; unmelted VECTRA® C particles were clearly visible in the VECTRA® A matrix.

EXAMPLE III

A piece of non-woven continuous filament LCP mat was placed between two KAPTON films, placed in a vacuum bag, and evacuated to remove air. The mat between the films was then pressed in a Tetrahedron Press at 293° C. and 32 psi for 2 minutes. This resulted in a melt consolidated film.

EXAMPLE IV

Ground scrap 1-mil LCP film flake is spread uniformly into a web and introduced as feed to a double belt press operating at sufficient speed, temperature and pressure to produce a fully consolidated 10-mil film with balanced properties useful as a dielectric material for rigid circuit boards.

EXAMPLE V

Chopped long glass fiber reinforced LCP strand (pellets) is spread on an even surface in a uniform layer and introduced as feed to a double belt press operating at sufficient speed, temperature and pressure to produce a fully consolidated 60-mil film with balanced properties useful for thermoforming into shaped articles.

EXAMPLE VI

Chopped LCP strand (pellets) is spread uniformly onto a glass fiber fabric and introduced as feed to a double belt press operating at sufficient speed, temperature and pressure to produce a fully consolidated 20-mil glass fabric reinforced sheet suitable as a dielectric material in electronic applications.

EXAMPLE VII

Two-mil uniaxially oriented LCP film flake is spread into a uniform mat onto a sheet of copper foil and then along with the copper foil fed into a double belt press operating at sufficient temperature, pressure and speed to fully consolidate the flake and laminate it to the copper foil in a single step. The result is a copper laminate with a dielectric having isotropic properties having utility for producing circuit boards. A second sheet of copper foil can be introduced on the other side of the LCP to produce a two-side copper laminate which is also useful in the electrical/electronics area.

Many variations of the present invention not illustrated or described herein will occur to those skilled in the art. The present invention is not limited to the embodiments illustrated and described, but encompasses all the subject matter within the scope of the appended claims.

I claim:

1. A multiaxially reinforced liquid crystal polymer article comprising a polymeric matrix and oriented particles in said matrix, said oriented particles comprising a first liquid crystal polymer and said matrix comprising a second liquid crystal polymer, said second liquid crystal polymer consisting essentially of one or more liquid crystal polymers having a lower melting point than said first liquid crystal polymer, wherein said oriented particles are randomly oriented in said matrix.

2. An article according to claim 1 in the form of a sheet.

3. A metal laminate comprising an article according to claim 2 bonded to a metal sheet.

4. A metal laminate according to claim 3 wherein said metal sheet comprises a metal selected from the group consisting of copper, aluminum, and silver.

5. An article according to claim 1 wherein at least one of said liquid crystal polymers is a polyester having repeating units derived from 4-hydroxybenzoic acid and 2,6-hydroxynaphthoic acid.

6. An article according to claim 1 wherein said first liquid crystal polymer is a polyester in which at least about 60 mole % of the repeating units are derived from 4-hydroxybenzoic acid, or 2,6-hydroxynaphthoic acid, or a combination thereof.

7. An article according to claim 1 wherein said second liquid crystal polymer is a polyester in which at least about 60 mole % of the repeating units are derived from 4-hydroxybenzoic acid, or 2,6-hydroxynaphthoic acid, or a combination thereof.

8. A multiaxially oriented liquid crystal polymer article comprising a polymeric matrix and oriented particles which are randomly oriented and distributed in said matrix, said particles and said polymeric matrix consisting essentially of a single liquid crystal polymer, wherein said article is formed according to the process comprising: pressing together oriented particles in a random orientation, said oriented particles comprising a single liquid crystal polymer, at a temperature no less than the melting temperature of said polymer, at a sufficient pressure and for a sufficient time to cause said particles to flow together and form said article.

9. An article according to claim 8 in the form of a sheet.

10. An article according to claim 8 wherein said liquid crystal polymer is a polyester in which at least about 60 mole % of the repeating units are derived from 4-hydroxybenzoic acid, or 2,6-hydroxynaphthoic acid, or a combination thereof.

* * * * *